(12) United States Patent
Chiba et al.

(10) Patent No.: US 11,393,673 B2
(45) Date of Patent: Jul. 19, 2022

(54) DEPOSITION METHOD

(71) Applicant: Tokyo Electron Limited, Tokyo (JP)

(72) Inventors: Takashi Chiba, Iwate (JP); Jun Sato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 58 days.

(21) Appl. No.: 16/876,444

(22) Filed: May 18, 2020

(65) Prior Publication Data

US 2020/0373156 A1     Nov. 26, 2020

(30) Foreign Application Priority Data

May 20, 2019  (JP) .............................. JP2019-094832

(51) Int. Cl.
  *H01L 21/02*     (2006.01)
(52) U.S. Cl.
  CPC .. *H01L 21/02164* (2013.01); *H01L 21/02211* (2013.01); *H01L 21/02274* (2013.01)
(58) Field of Classification Search
  None
  See application file for complete search history.

(56) References Cited

U.S. PATENT DOCUMENTS

| 2010/0267248 A1* | 10/2010 | Ma ..................... H01L 21/3105 438/787 |
| 2011/0039026 A1* | 2/2011 | Kato ................. C23C 16/45551 427/255.26 |
| 2020/0370178 A1* | 11/2020 | Chiba ................. H01L 21/0234 |

FOREIGN PATENT DOCUMENTS

JP          2013-135154          7/2013

* cited by examiner

*Primary Examiner* — Asok K Sarkar
(74) *Attorney, Agent, or Firm* — IPUSA, PLLC

(57) ABSTRACT

A deposition method includes a first process performed by repeating causing aminosilane gas to be adsorbed on a substrate; causing a first silicon oxide film to be stacked on the substrate by supplying oxidation gas to the substrate to oxidize the aminosilane gas adsorbed on the substrate; and performing a reforming process on the first silicon oxide film by activating a first reformed gas by plasma and supplying the first reformed gas to the first silicon oxide film, and a second process, performed after the first process, by repeating causing aminosilane gas to be adsorbed on the substrate; causing a second silicon oxide film to be stacked on the substrate by supplying oxidation gas; and performing a reforming process on the second silicon oxide film by supplying a plasma-activated second reformed gas. The first reformed gas has a smaller effect of oxidizing the substrate than the second reformed gas.

6 Claims, 13 Drawing Sheets

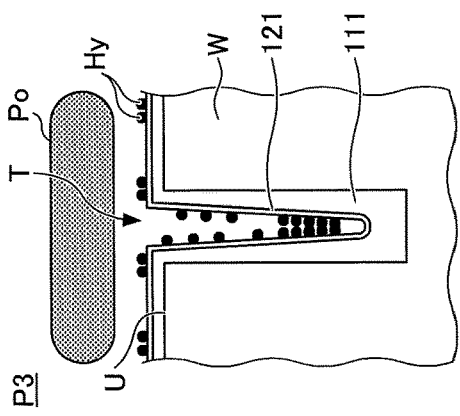
FIG.11D
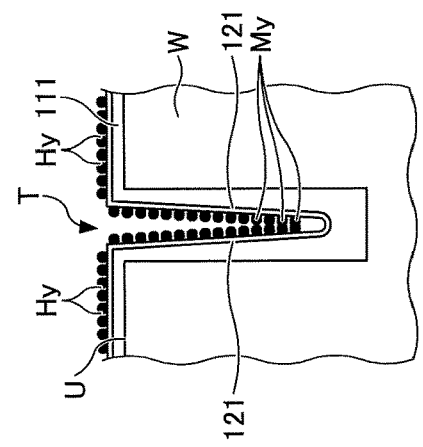
FIG.11C
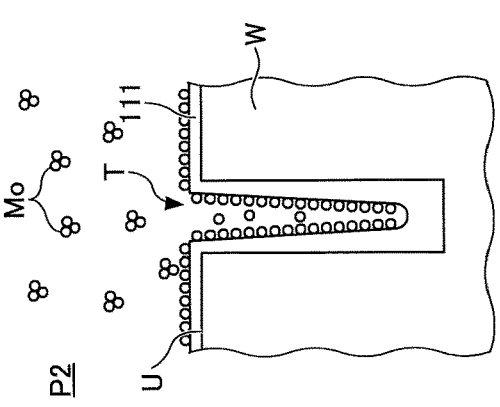
FIG.11B
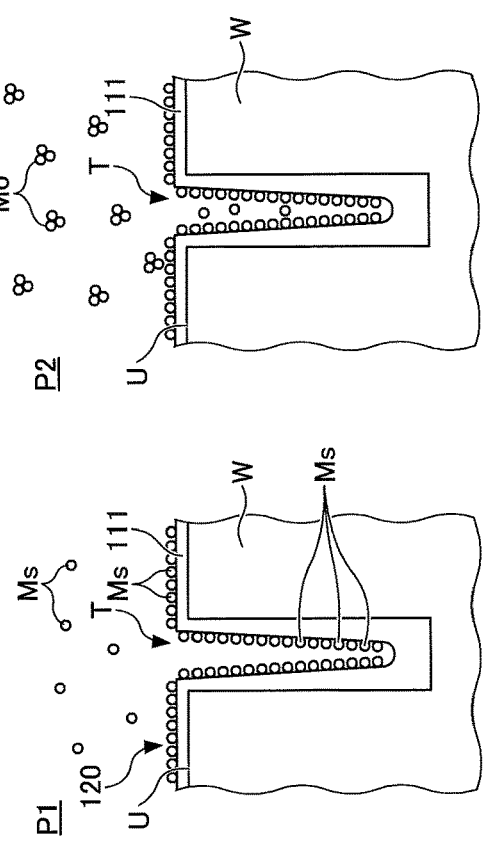
FIG.11A
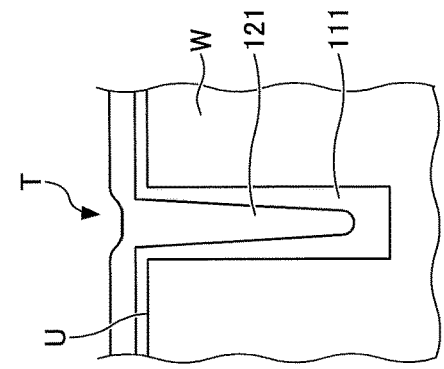
FIG.11G
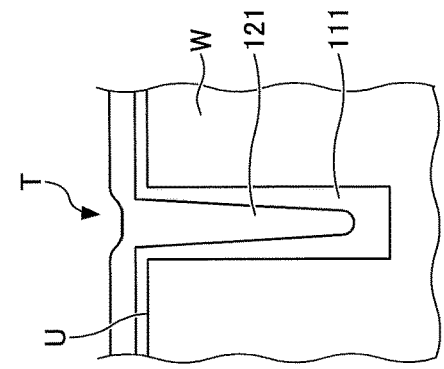
FIG.11F
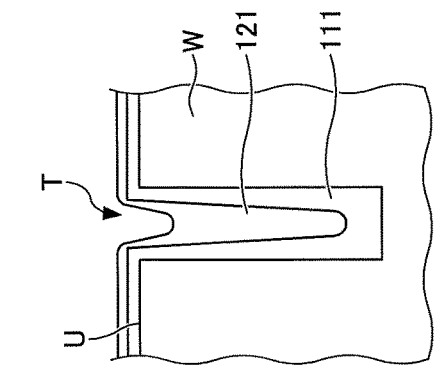
FIG.11E
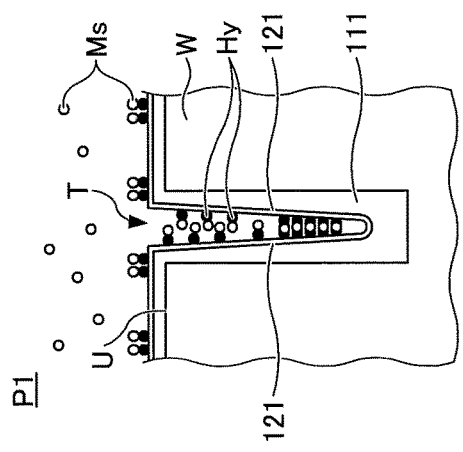

DEPOSITION METHOD

CROSS-REFERENCE TO RELATED APPLICATION

The present application is based upon and claims the benefit of priority of Japanese Patent Application No. 2019-094832, filed on May 20, 2019, the entire contents of which are incorporated herein by reference.

TECHNICAL FIELD

The present disclosure relates to a deposition method.

BACKGROUND

There is known a method in which a first reaction gas and a second reaction gas that react with each other are alternately supplied into a recessed portion formed in a substrate, to deposit a reaction product of the first reaction gas and the second reaction gas in the recessed portion (see, for example, Patent Document 1). In this method, prior to supplying the first reaction gas, a step of causing a hydroxyl group to be adsorbed by a desired distribution onto the inner surface of the recessed portion formed in the substrate, is performed. Further, as an example of causing the hydroxyl group to be adsorbed by a desired distribution, Patent Document 1 describes an example in which the substrate is exposed to an oxygen plasma generated from a gas including a hydrogen-including gas to supplement an insufficient hydroxyl group, in the step of adsorbing the hydroxyl group.
Patent Document 1: Japanese Unexamined Patent Application Publication No. 2013-135154

SUMMARY

In view of the above, an aspect of the present disclosure relates to a technology of depositing a silicon oxide film having a good film quality on a substrate, while preventing the oxidation of the substrate.

According to one aspect of the present invention, there is provided a deposition method including a first process performed by repeating causing aminosilane gas to be adsorbed on a substrate; causing a first silicon oxide film to be stacked on the substrate by supplying oxidation gas to the substrate to oxidize the aminosilane gas adsorbed on the substrate; and performing a reforming process on the first silicon oxide film by activating a first reformed gas by plasma and supplying the first reformed gas to the first silicon oxide film, and a second process, performed after the first process, by repeating causing aminosilane gas to be adsorbed on the substrate; causing a second silicon oxide film to be stacked on the substrate by supplying oxidation gas to the substrate to oxidize the aminosilane gas adsorbed on the substrate; and performing a reforming process on the second silicon oxide film by activating a second reformed gas by plasma and supplying the second reformed gas to the second silicon oxide film, wherein the first reformed gas has a smaller effect of oxidizing the substrate than the second reformed gas.

BRIEF DESCRIPTION OF THE DRAWINGS

FIGS. 11A to 11G are diagrams illustrating a second process of the deposition method according to one embodiment;

DETAILED DESCRIPTION

Figure 1:
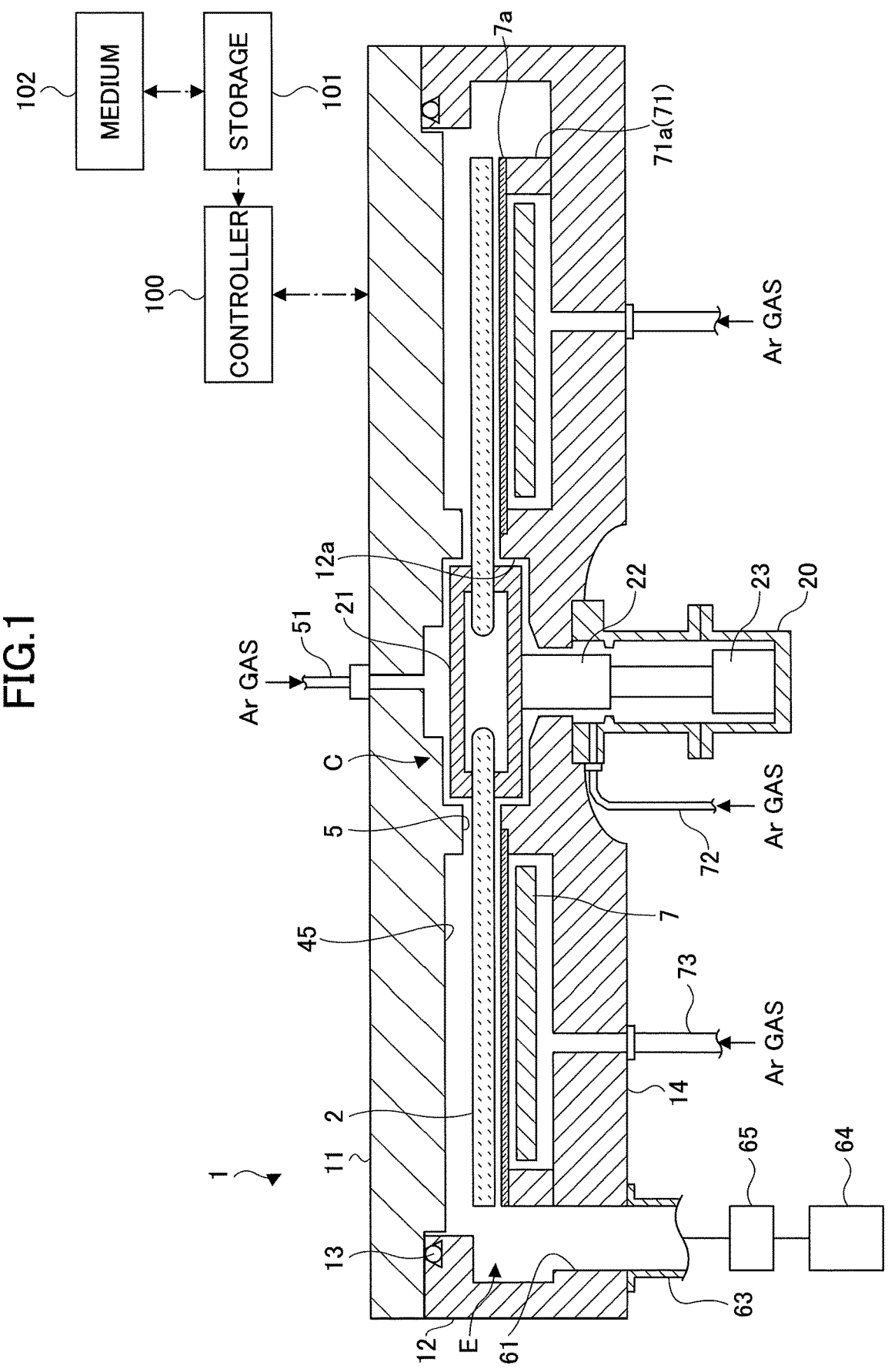
FIG. 1 is a cross-sectional view illustrating an example of a configuration of a deposition, apparatus according to one embodiment.

Hereinafter, non-limiting exemplary embodiments of the present disclosure will be described with reference to the accompanying drawings. In all the accompanying drawings, the same or corresponding reference numerals will be applied to the same or corresponding members or components, and overlapping descriptions will be omitted.

(Deposition Apparatus)

Figure 2:
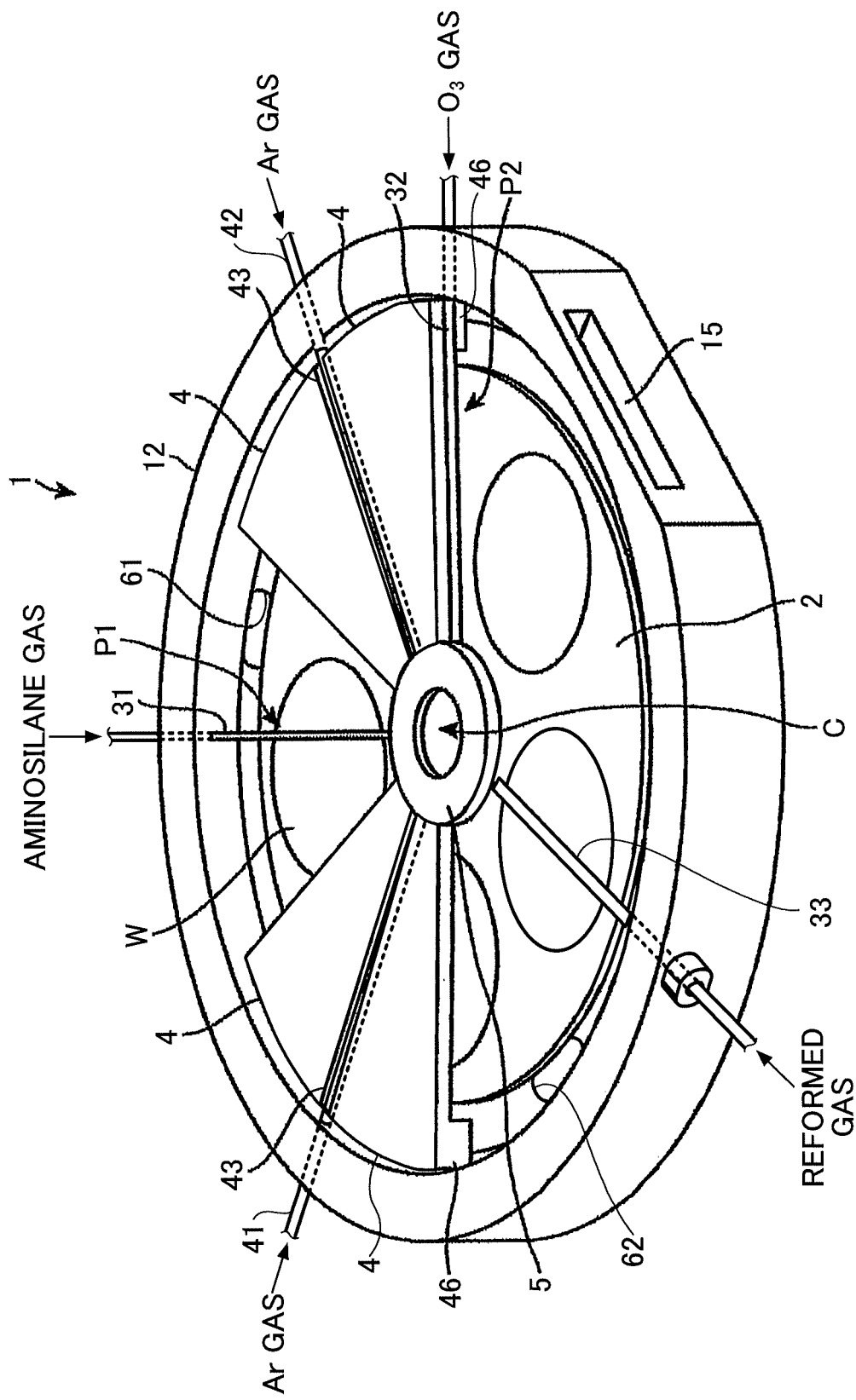
FIG. 2 is a perspective view of the configuration in a vacuum vessel of the deposition apparatus of FIG. 1.
Figure 3:
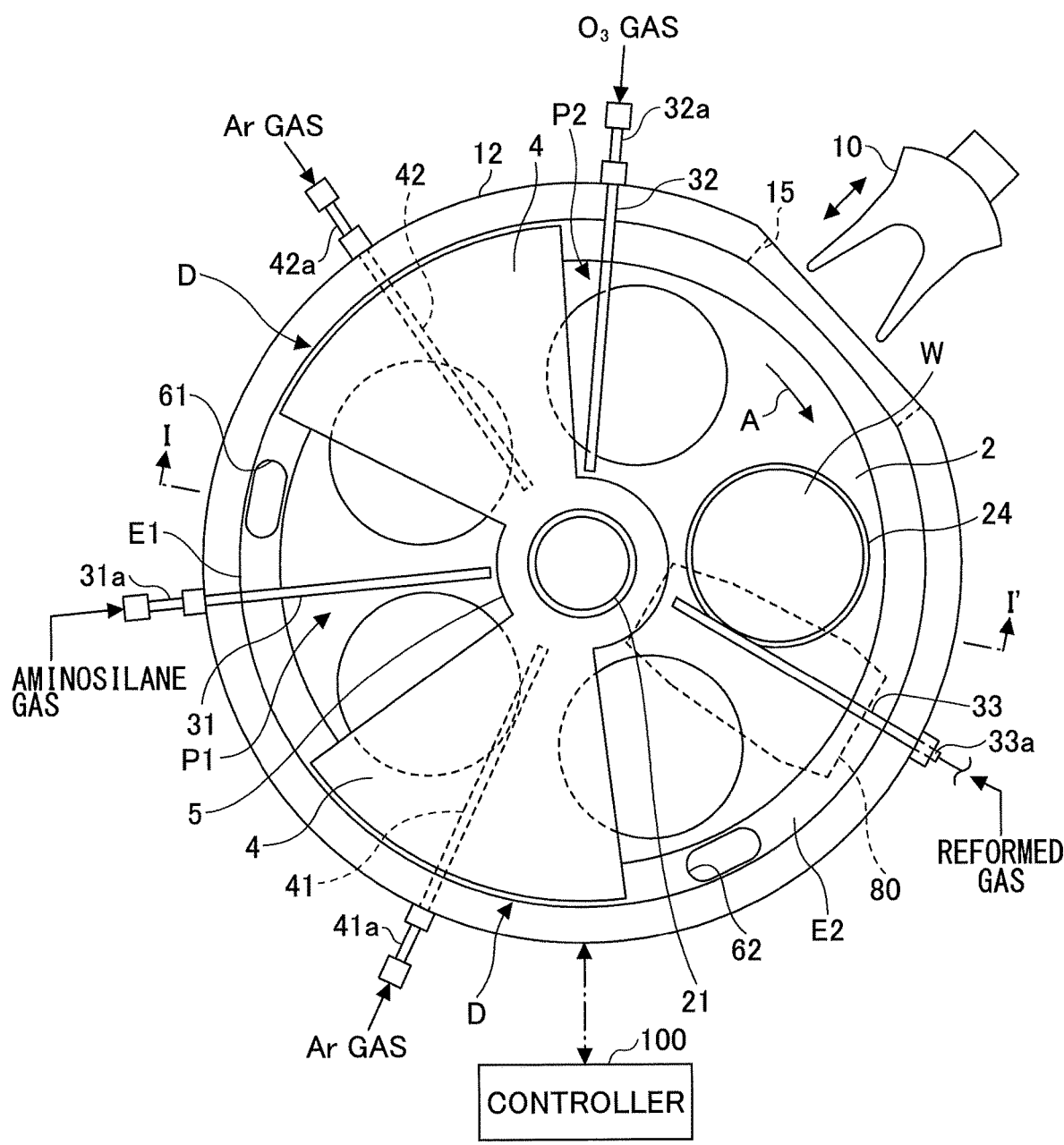
FIG. 3 is a plan view illustrating a configuration in the vacuum vessel of the deposition apparatus of FIG. 1.

A deposition apparatus suitable for carrying out a deposition method according to one embodiment will be described. Referring to FIGS. 1 to 3, a deposition apparatus includes a flat vacuum vessel 1 having a substantially circular planar shape, and a rotation table 2, which is disposed in the vacuum vessel 1 and which has a rotational center at the center of the vacuum vessel 1. The vacuum vessel 1 has a vessel body 12 having a cylindrical shape with a bottom and a top plate 11 which is disposed in a detachable manner with respect to the top surface of the vessel body 12 in an airtight manner through a sealing member 13 (FIG. 1), such as an O-ring, for example.

The rotation table 2 is fixed to a cylindrical core portion 21 at the center. The core portion 21 is fixed to the upper end of a rotating shaft 22 extending in a vertical direction. The rotating shaft 22 passes through a bottom portion 14 of the vacuum vessel 1, and a lower end of the rotating shaft 22 is attached to a driving unit 23 which rotates the rotating shaft 22 (FIG. 1) about a vertical axis. The rotating shaft 22 and the driving unit 23 are accommodated in a cylindrical case body 20 having an open top surface. A flange portion provided on the upper surface of the case body 20 is attached in an airtight manner to the lower surface of the bottom portion 14 of the vacuum vessel 1, and the internal atmosphere of the case body 20 are maintained in an airtight state with respect to the external atmosphere.

The surface of the rotation table 2 is provided with circular recessed portions 24 for mounting semiconductor wafers (hereinafter, referred to as a "wafer W") that are a plurality of (five sheets in the example illustrated) substrates, along the rotational direction (the circumferential direction) as illustrated in FIGS. 2 and 3. Note that as a matter of convenience, in FIG. 3, the wafer W is illustrated only in one recessed portion 24. The recessed portion 24 has an inner diameter that is greater than the diameter of the wafer W by, for example, 4 mm, and has a depth that is approximately equal to the thickness of the wafer W. Therefore, when the wafer W is accommodated in the recessed portion 24, the surface of the wafer W and the surface of the rotation table 2 (the region in which the wafer W is not mounted) will have the same height. In the bottom surface of the recessed portion 24, through holes (not illustrated) are formed, through which, for example, three raising/lowering pins are penetrated to raise and lower the wafer W while supporting the back surface of the wafer W.

FIGS. 2 and 3 illustrate the structure within the vacuum vessel 1, and as a matter of convenience for explanation, the top plate 11 is not illustrated. As illustrated in FIGS. 2 and 3, above the rotation table 2, reaction gas nozzles 31, 32, and 33 and separation gas nozzles 41 and 42 made of, for example, quartz, are disposed in a circumferential direction of the vacuum vessel 1 (the rotational direction of the rotation table 2 illustrated by an arrow A of FIG. 3) so as to be spaced apart from each other. In the example illustrated, the reaction gas nozzle 33, the separation gas nozzle 41, the reaction gas nozzle 31, the separation gas nozzle 42, and the reaction gas nozzle 32 are arranged in the stated order in a clockwise manner (rotational direction of the rotation table 2) from a conveying port 15 to be described below. The reaction gas nozzles 31, 32, and 33 and the separation gas nozzles 41 and 42 respectively have base end parts that are gas introduction ports 31a, 32a, 33a, 41a, and 42a (FIG. 3), which are fixed to the outer peripheral wall of the vessel body 12. The reaction gas nozzles 31, 32, and 33 and the separation gas nozzles 41 and 42 are introduced from the outer peripheral wall of the vacuum vessel 1 into the vacuum vessel 1 and are attached along the radial direction of the vessel body 12 so as to extend horizontally with respect to the rotation table 2.

Note that above the reaction gas nozzle 33 in FIG. 3, a plasma source 80 is provided, as indicated in a simplified manner by dashed lines. The plasma source 80 will be described later.

The reaction gas nozzle 31 is connected to a supply source (not illustrated) of aminosilane gas via piping, a flow control device, and the like (not illustrated). For example, as the aminosilane gas, DIPAS [diisopropylaminosilane], 3DMAS [tris-dimethylaminosilane] gas, and BTBAS [(bistertial butylamino)silane] may be used.

The reaction gas nozzle 32 is connected to a supply source (not illustrated) of oxidation gas via piping, a flow control device, and the like (not illustrated). For example, an ozone ($O_3$) gas may be used as the oxidation gas.

The reaction gas nozzle 33 is connected to a supply source (not illustrated) of reformed gas via piping, a flow control device, and the like (not illustrated). For example, as the reformed gas, argon (Ar) gas, helium (He) gas, and oxygen ($O_2$) gas may be used.

The separation gas nozzles 41 and 42 are connected to a supply source (not illustrated) of separation gas via piping, flow control valves, and the like (not illustrated). For example, as the separation gas, Ar gas and nitrogen ($N_2$) gas may be used.

In the reaction gas nozzles 31 and 32, a plurality of discharge holes 31h and 32h (FIG. 4) that open toward the rotation table 2, are arranged along the length direction of the reaction gas nozzles 31 and 32, respectively, for example, with intervals of 10 mm. The lower region of the reaction gas nozzle 31 is an aminosilane gas adsorption region P1 for causing the aminosilane gas to be adsorbed onto the wafer W. The lower region of the reaction gas nozzle 32 is an oxidation gas supply region P2 which oxidizes the aminosilane gas adsorbed on the wafer W in the aminosilane gas adsorption region P1. Note that the configuration of the reaction gas nozzle 33, which is not illustrated in FIG. 4, will be described later.

Referring to FIGS. 2 and 3, two projecting portions 4 are provided in the vacuum vessel 1. The projecting portion 4 constitutes a separation region D together with the separation gas nozzles 41 and 42, and is attached to the back surface of the top plate 11 so as to protrude toward the rotation table 2 as described later. The projecting portion 4 has a fan-like planar shape in which the top portion is cut in an arc-like manner, and in one embodiment, the inner arc is connected to a protrusion 5 (described below) and the outer arc is disposed along the inner peripheral surface of the vessel body 12 of the vacuum vessel 1.

Figure 4:
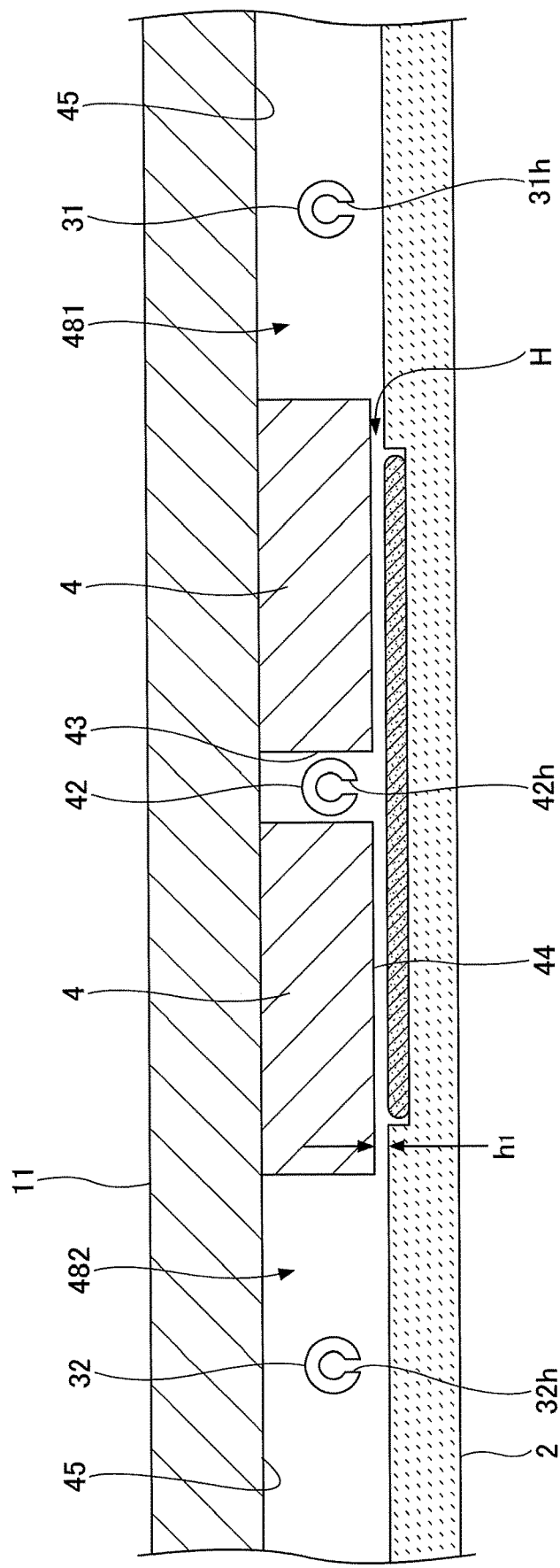
FIG. 4 is a cross-sectional view of the vacuum vessel along a concentric circle of a rotation table rotatably provided in the vacuum vessel of the deposition apparatus of FIG. 1.

FIG. 4 illustrates a cross-section of the vacuum vessel 1 along the concentric circle of the rotation table 2 from the reaction gas nozzle 31 to the reaction gas nozzle 32. As illustrated in FIG. 4, the projecting portion 4 is attached on the back surface of the top plate 11. Therefore, within the vacuum vessel 1, there exists a flat low ceiling surface (first ceiling surface 44) that is a lower surface of the projecting portion 4 and a ceiling surface (second ceiling surface 45) that is higher than the first ceiling surface 44 and that is located on both sides of the first ceiling surface 44 in the circumferential direction. The first ceiling surface 44 has a fan-like planar shape with the top part cut into an arc-shape. As illustrated, the projecting portion 4 is provided with a radially extending groove portion 43 in the center in the circumferential direction, and the separation gas nozzle 42 is accommodated within the groove portion 43. Similarly, in the other projecting portion 4, the groove portion 43 is formed, and the separation gas nozzle 41 is accommodated in the groove portion 43. Further, the reaction gas nozzles 31 and 32 are provided in the space below the second ceiling surface 45. These reaction gas nozzles 31 and 32 are provided in the vicinity of the wafer W so as to be spaced apart from the second ceiling surface 45. As illustrated in FIG. 4, the reaction gas nozzle 31 is provided in a space 481 below the second ceiling surface 45 on the right side of the projecting portion 4, and the reaction gas nozzle 32 is provided in a space 482 below the second ceiling surface 45 on the left side of the projecting portion 4.

In the separation gas nozzle 42 accommodated in the groove portion 43 of the projecting portion 4, a plurality of discharge holes 42h (see FIG. 4) that open toward the rotation table 2 are arranged, along the length direction of the separation gas nozzle 42, with intervals of, for example, 10 mm. Similarly, in the separation gas nozzle 41 accommodated in the groove portion 43 of the other projecting portion 4, a plurality of discharge holes 41h that open toward the rotation table 2 are arranged, along the length direction of the separation gas nozzle 41, with intervals of, for example, 10 mm.

The first ceiling surface 44 forms a separation space H, which is a narrow space, with respect, to the rotation table 2. When Ar gas is supplied from the discharge holes 42h of the separation gas nozzle 42, the Ar gas flows through the separation space H toward the spaces 481 and 482. At this time, the capacity of the separation space H is smaller than the capacity of the spaces 481 and 482, and, therefore, the pressure of the separation space H can be increased, by the Ar gas, compared to the pressure of the spaces 481 and 482. That is, the separation space H having high pressure is formed between the spaces 481 and 482. Further, the Ar gas flowing from the separation space H into the spaces 481 and 482 also serves as a counter-flow with respect to the aminosilane gas from the aminosilane gas adsorption region P1 and the oxidation gas from the oxidation gas supply region P2. Thus, the aminosilane gas from the aminosilane gas adsorption region P1 and the oxidation gas from the oxidation gas supply region P2 are separated by the separation space H. Therefore, in the vacuum vessel 1, the aminosilane gas and the oxidation gas are prevented from mixing with each other and reacting with each other.

A height h1 of the first ceiling surface 44 relative to the upper surface of the rotation table 2 is set to a height suitable for increasing the pressure of the separation space H compared to the pressure of the spaces 481 and 482, in consideration of the pressure in the vacuum vessel 1, the rotational speed of the rotation table 2, the flow rate of the separation gas (Ar gas), etc., at the time of deposition.

On the other hand, on the lower surface of the top plate 11, the protrusion 5 (FIGS. 2 and 3) that surrounds the outer circumference of the core portion 21 that fixes the rotation table 2 is provided. In one embodiment, the protrusion 5 is continuous with a portion of the projecting portion 4 on the side of the rotational center, and the lower surface of the protrusion 5 is formed at the same height as the first ceiling surface 44.

Figure 5:
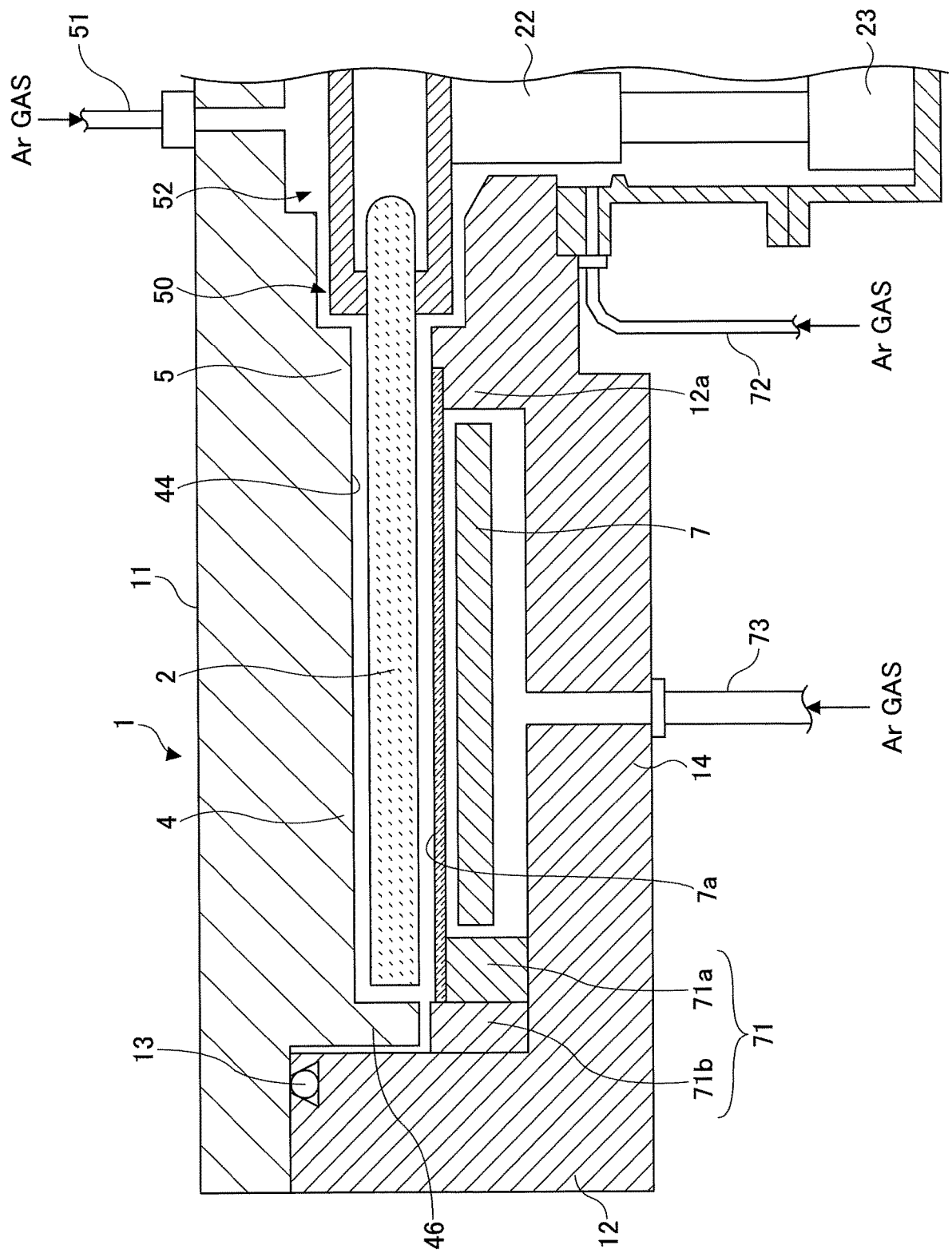
FIG. 5 is another cross-sectional view of the deposition apparatus of FIG. 1.

FIG. 1 referred to above is a cross-sectional view along the I-I' line of FIG. 3, and illustrates the region where the second ceiling surface 45 is provided. FIG. 5 is a cross-sectional view illustrating a region where the first ceiling surface 44 is provided. As illustrated in FIG. 5, a bent portion 46 that bends in an L-shape facing the outer end surface of the rotation table 2, is formed at the periphery of the fan-shaped projecting portion 4 (a portion on the outer edge of the vacuum vessel 1). Similar to the projecting portion 4, the bent portion 46 prevents the reaction gas from entering from both sides of the separation region D, thereby preventing the mixing of the aminosilane gas and the oxidation gas. The fan-shaped projecting portion 4 is provided on the top plate 11 and the top plate 11 can be removed from the vessel body 12, and, therefore, there is a slight gap between the outer peripheral surface of the bent portion 46 and the vessel body 12. The gap between the inner peripheral surface of the bent portion 46 and the outer end surface of the rotation table 2 and the gap between the outer peripheral surface of the bent portion 46 and the vessel body 12 are set, for example, to a dimension similar to the height of the first ceiling surface 44 relative to the upper surface of the rotation table 2.

The inner peripheral wall of the vessel body 12 is formed in a vertical plane in proximity with the outer peripheral surface of the bent portion 46 in the separation region D (FIG. 5), but in portions other than the separation region D, for example, the inner peripheral wall is recessed outwardly from the portion facing the outer end surface of the rotation table 2 to the bottom portion 14 (FIG. 1). Hereinafter, as a matter of convenience for explanation, the recessed portion having a substantially rectangular cross-sectional shape is referred to as an exhaust region E. Specifically, the exhaust region communicating with the aminosilane gas adsorption region P1 is referred to as a first exhaust region E1, and the region communicating with the oxidation gas supply region P2 is referred to as a second exhaust region E2. At the bottom of the first exhaust region E1 and the second exhaust region E2, a first exhaust port 61 and a second exhaust port 62 are formed, respectively, as illustrated in FIGS. 1 to 3. The first exhaust port 61 and the second exhaust port 62 are each connected, via an exhaust pipe 63, to a vacuum pump 64 that is a vacuum exhaust part, for example, as illustrated in FIG. 1. Note that in FIG. 1, a pressure controller 65 is illustrated.

The space between the rotation table 2 and the bottom portion 14 of the vacuum vessel 1 is provided with a heater unit 7 which is a heater as illustrated in FIGS. 1 and 5, and the wafer W on the rotation table 2 is heated, via the rotation table 2, to a temperature (e.g., 400° C.) determined by a process recipe. Below the vicinity of the circumferential edge of the rotation table 2, a ring-shaped cover member 71 is provided (FIG. 5). The cover member 71 partitions the atmosphere from the upper space of the rotation table 2 to the first exhaust region E1 and the second exhaust region E2, and the atmosphere in which the heater unit 7 is disposed, to prevent gas from entering the lower region of the rotation table 2. The cover member 71 includes an inner member 71a disposed to face, from below, the outer edge of the rotation table 2 and the outer peripheral side with respect to the outer edge, and an outer member 71b disposed between the inner member 71a and the inner peripheral surface of the vacuum vessel 1. The outer member 71b is provided below the bent portion 46 formed on the outer edge of the projecting portion 4 in the separation region D, and is in close proximity to the bent portion 46. The inner member 71a surrounds the heater unit 7 throughout the entire circumference below the outer edge of the rotation table 2 (and below the portion that is slightly on the outer side with respect to the outer edge).

The bottom portion 14, at a portion on the side closer to the rotational center than the space in which the heater unit 7 is disposed, protrudes upwardly into proximity to the core portion 21 near the center of the lower surface of the rotation table 2, thereby forming a protrusion 12a. The space between the protrusion 12a and the core portion 21 is narrow, and the gap between the inner peripheral surface of the through hole of the rotating shaft 22 passing through the bottom portion 14 and the rotating shaft 22 is narrow, and these narrow spaces communicate with the case body 20. The case body 20 is provided with a purge gas supply pipe 72 for supplying Ar gas that is purge gas into the narrow space to purge the narrow space. Further, at the bottom portion 14 of the vacuum vessel 1, a plurality of purge gas supply pipes 73 are provided to purge the space in which the heater unit 7 is disposed, at predetermined angular intervals in the circumferential direction below the heater unit 7 (in FIG. 5, one of the purge gas supply pipes 73 is illustrated). Further, a lid member 7a is provided between the heater unit 7 and the rotation table 2, so as to cover the portion between the inner peripheral wall of the outer member 71b (the upper surface of the inner member 71a) and the upper end of the protrusion 12a across the circumferential direction, in order to prevent gas from entering the region where the heater unit 7 is provided. The lid member 7a is formed, for example, of quartz.

Further, to the center of the top plate 11 of the vacuum vessel 1, a separation gas supply pipe 51 is connected, which is configured to supply Ar gas, which is the separation gas, to a space 52 between the top plate 11 and the core portion 21. The separation gas supplied to the space 52 is discharged toward the peripheral edge along the surface of the wafer mounting region side of the rotation table 2 via a narrow gap 50 between the protrusion 5 and the rotation table 2. The gap 50 can be maintained at a pressure higher than the pressure in the spaces 481 and 482 by the separation gas. Accordingly, the gap 50 prevents the aminosilane gas supplied to the aminosilane gas adsorption region P1 and the oxidation gas supplied to the oxidation gas supply region P2, from passing through a central region C and mixing with each other. That is, the gap 50 (or the central region C) functions in the same manner as the separation space H (or the separation region D).

Further, as illustrated in FIGS. 2 and 3, on the side wall of the vacuum vessel 1, there is formed the conveying port 15 for transferring the wafer W between an external conveying arm 10 and the rotation table 2. The conveying port 15 is opened and closed by a gate valve (not illustrated). Below the rotation table 2, at a portion corresponding to the transferring position of the wafer W, a raising/lowering pin and a raising and lowering mechanism thereof (not illustrated) for lifting the wafer W from the back surface through the recessed portion 24 and transferring the wafer W, are provided.

Figure 6:
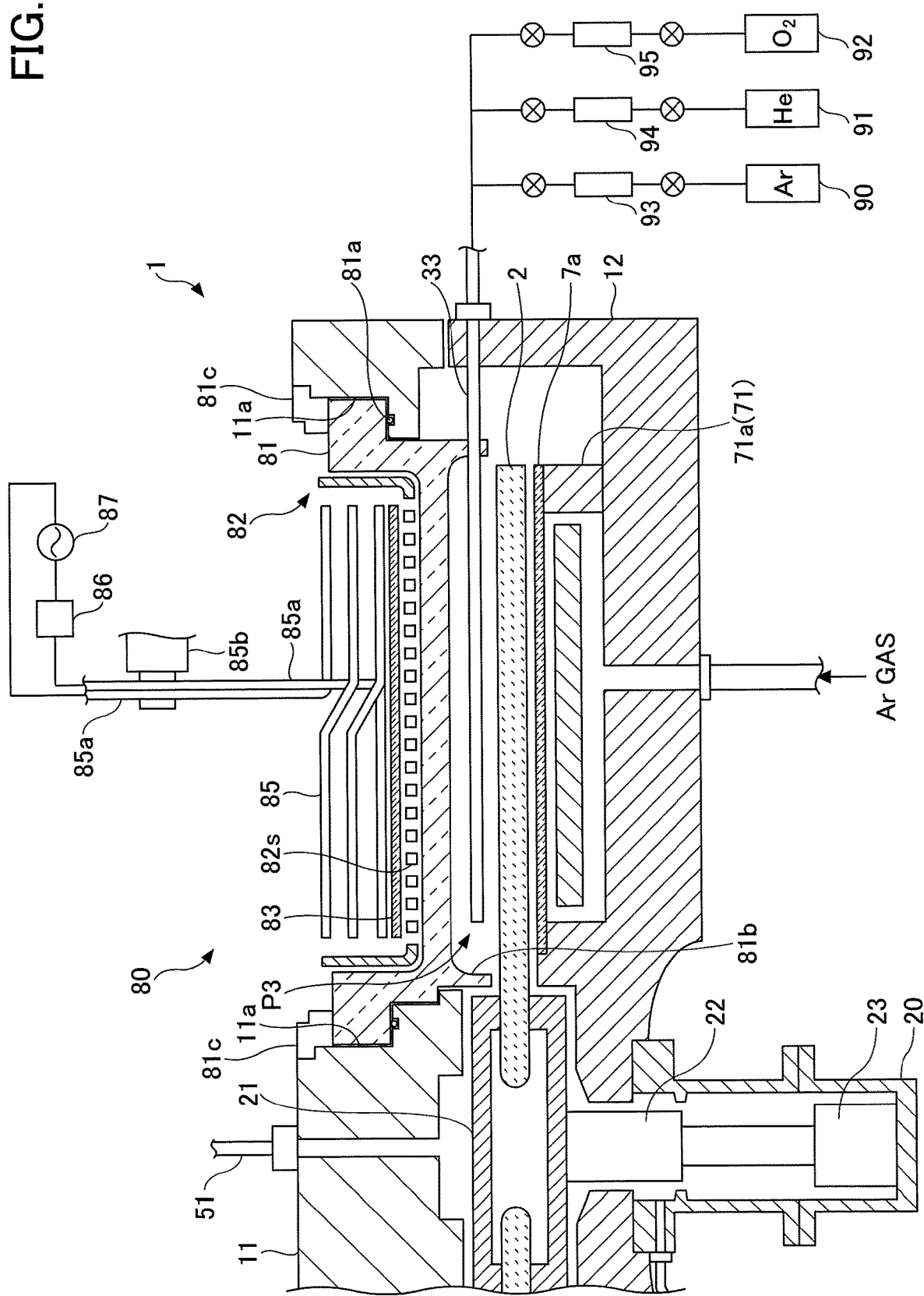
FIG. 6 is a cross-sectional view of a plasma source provided in the deposition apparatus of FIG. 1.
Figure 7:
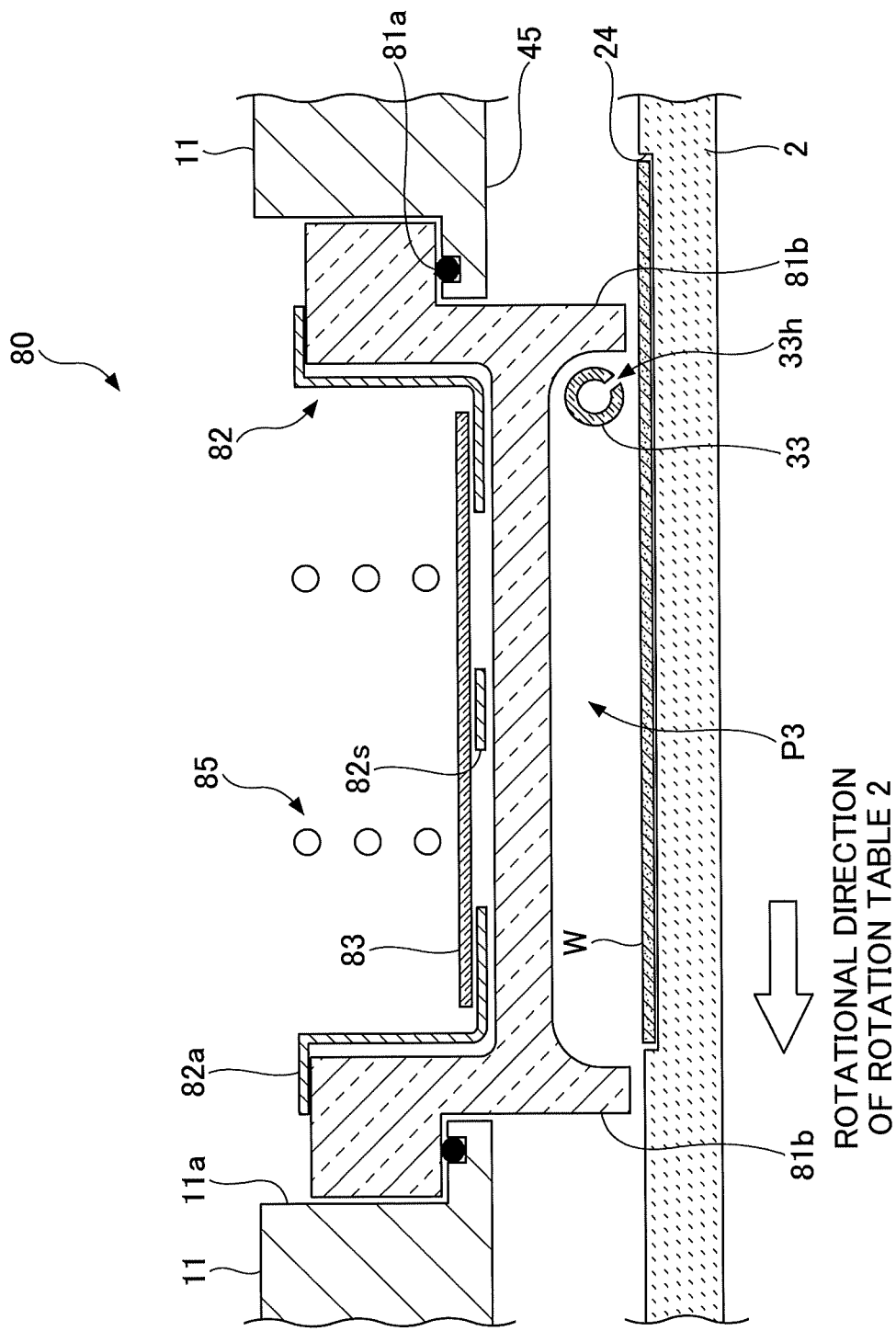
FIG. 7 is another cross-sectional view of the plasma source provided in the deposition apparatus of FIG. 1.
Figure 8:
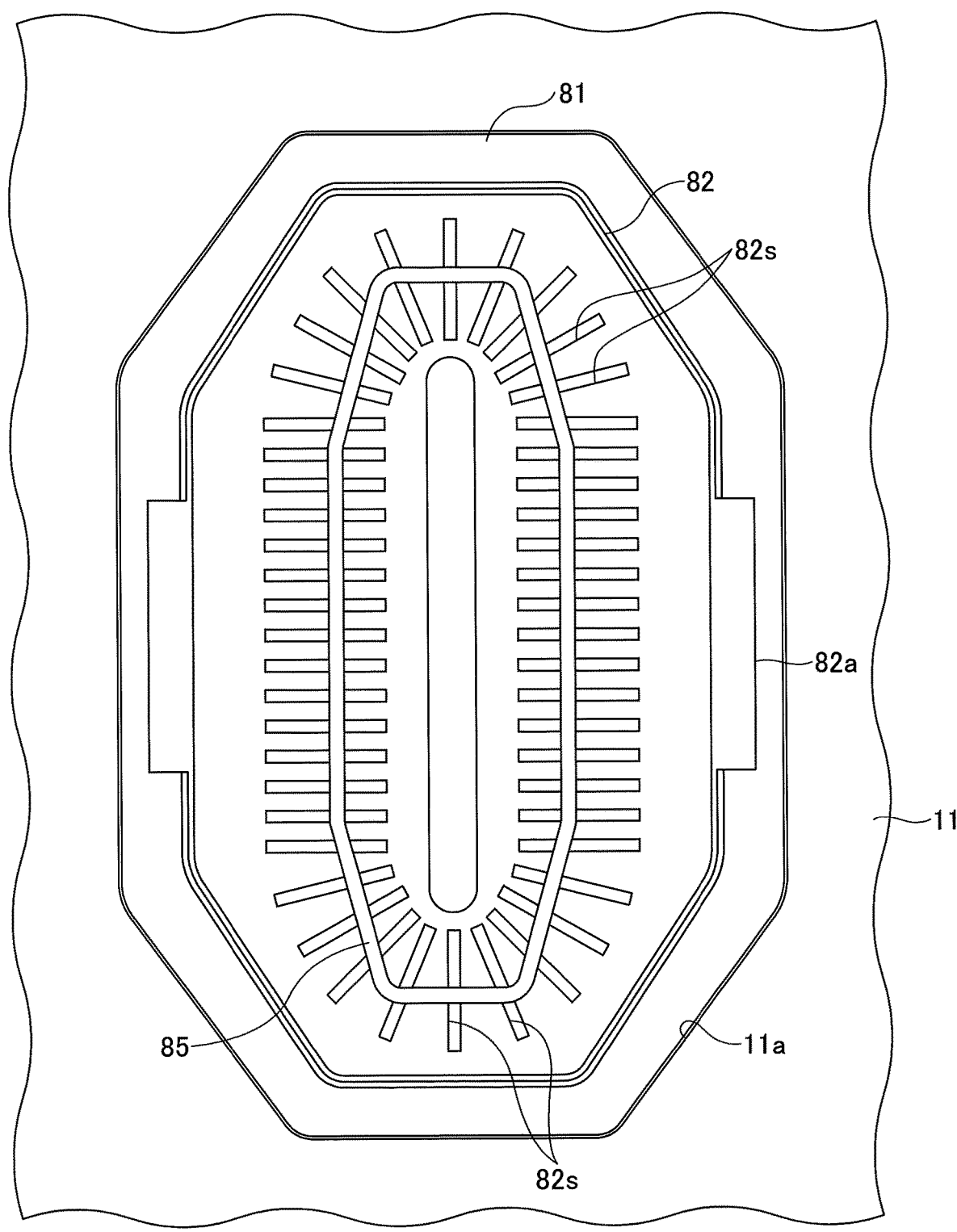
FIG. 8 is a top view of the plasma source provided in the deposition apparatus of FIG. 1.

Next, the plasma source 80 will be described with reference to FIGS. 6 to 8. FIG. 6 is a cross-sectional view of the plasma source 80 provided in the deposition apparatus of FIG. 1, illustrating a cross-section of the plasma source 80 along the radial direction of the rotation table 2. FIG. 7 is another cross-sectional view of the plasma source 80 provided in the deposition apparatus of FIG. 1, illustrating a cross-section of the plasma source 80 along a direction perpendicular to the radial direction of the rotation table 2. FIG. 8 is a top view of the plasma source 80 provided in the deposition apparatus of FIG. 1. As a matter of convenience for illustration, some members are simplified in these figures.

Referring to FIG. 6, the plasma source 80 includes a frame member 81, a Faraday shield plate 82, an insulating plate 83, and an antenna 85. The frame member 81 is made of a radio frequency transmissive material, and has a recessed portion recessed from the top surface, and is fitted into an opening portion 11a formed in the top plate 11. The Faraday shield plate 82 is accommodated within the recessed portion of the frame member 81 and has a substantially box-like shape with the top portion opened. The insulating plate 83 is disposed on the bottom surface of the Faraday shield plate 82. The antenna 83 is supported above the insulation plate 83 and is formed into a coil having a substantially octagonal planar shape.

The opening portion 11a of the top plate 11 has a plurality of steps, and one of the steps forms a groove portion around the entire circumference, and a seal member 81a, such as an O-ring, is fitted into the groove portion. On the other hand, the frame member 81 has a plurality of steps corresponding to steps of the opening portion 11a. Accordingly, when the frame member 81 is fitted into the opening portion 11a, the back surface of one of the steps of the frame member 81 comes into contact with the seal member 81a fitted into the groove portion of the opening portion 11a, so that the airtightness between the top plate 11 and the frame member 81 is maintained. Further, as illustrated in FIG. 6, a pressing member 81c is provided along an outer periphery of the frame member 81 fitted into the opening portion 11a of the top plate 11 so that the frame member 81 is pressed downward against the top plate 11. Thus, the airtightness between the top plate 11 and the frame member 81 is more reliably maintained.

The lower surface of the frame member 81 faces the rotation table 2 in the vacuum vessel 1, and the outer periphery of the lower surface is provided with a projection 81b projecting downward (toward the rotation table 2) along the entire circumference. The lower surface of the projection 81b is close to the surface of the rotation table 2, and a plasma processing region P3 is defined above the rotation table 2 by the projection 81b, the surface of the rotation table 2, and the lower surface of the frame member 81. Note that the interval between the lower surface of the projection 81b and the surface of the rotation table 2 may be approximately the same as the height h1 of the first ceiling surface 44 with respect to the upper surface of the rotation table 2 in the separation space H (FIG. 4).

Further, the reaction gas nozzle 33, which passes through the protrusion 81b, extends in the plasma processing region P3. In one embodiment, the reaction gas nozzle 33 is connected with an argon gas source 90 to be filled with Ar gas, a helium gas source 91 to be filled with He gas, and an oxygen gas source 92 to be filled with $O_2$ gas, as illustrated in FIG. 6. Ar gas, He gas, and $O_2$ gas, for which the flow rates are controlled by corresponding flow rate controllers 93, 94, and 95, respectively, are supplied from the argon gas source 90, the helium gas source 91, and the oxygen gas source 92, to the plasma processing region P3 at a predetermined flow rate ratio (mixing ratio).

Further, a plurality of discharge holes 33h are formed in the reaction gas nozzle 33 along a longitudinal direction at predetermined intervals (for example, 10 mm), and the aforementioned Ar gas, He gas, and $O_2$ gas are discharged from the discharge holes 33h. As illustrated, in FIG. 7, the discharge hole 33h is inclined from a direction perpendicular to the rotation table 2 toward the upstream side of the rotational direction of the rotation table 2. For this reason, the mixture gas supplied from the reaction gas nozzle 33 is discharged in a direction opposite to the rotational direction of the rotation table 2; specifically toward a gap between the lower surface of the projection 81b and the surface of the rotation table 2. This prevents oxidation gas or separation gas from flowing into the plasma processing region P3 from the space below the second ceiling surface 45 located upstream of the plasma source 80 along the rotational direction of the rotation table 2. Further, as described above, the projection 81b formed along the outer periphery of the lower surface of the frame member 81 is close to the surface of the rotation table 2, and, therefore, the pressure in the plasma processing region P3 can be easily maintained at a high level by the gas from the reaction gas nozzle 33. This also prevents oxidation gas or separation gas from flowing into the plasma processing region P3.

The Faraday shield plate 82 is made of a conductive material such as metal, and is grounded, although not illustrated. As clearly illustrated in FIG. 8, a plurality of slits 82s are formed at the bottom of the Faraday shield plate 82. Each of the slits 82s extends substantially perpendicular to the corresponding side of the antenna 85 having a substantially octagonal planar shape.

Further, the Faraday shield plate 82 also includes outwardly bending supports 82a at two top end locations, as illustrated in FIGS. 7 and 8. The support 82a is supported on the upper surface of the frame member 81, and, therefore, the Faraday shield plate 82 is supported at a predetermined location within the frame member 81.

The insulating plate 83 is made of, for example, quartz glass, and is slightly smaller than the bottom surface of the Faraday shield plate 82, and is mounted on the bottom surface of the Faraday shield plate 82. The insulating plate 83 insulates the Faraday shield plate 82 and the antenna 85 from each other, while transmitting downward the high frequencies radiated from the antenna 85.

The antenna 85 is formed by winding a hollow tube (pipe) made of copper, for example, in triples, such that the planar shape is substantially octagonal. Cooling water can be circulated in the pipe to prevent the antenna 85 from being heated to a high temperature by high frequencies supplied to the antenna 85. Further, the antenna 85 is provided with a standing portion 85*a*, and a supporting portion 85*b* is attached to the standing portion 85*a*. The supporting portion 85*b* maintains the antenna 85 at a predetermined position within the Faraday shield plate 82. Further, a radio frequency power source 87 is connected to the supporting portion 85*b* via a matching box 86. The radio frequency power source 87 generates a radio frequency having, for example, a frequency of 13.56 MHz.

According to the above plasma source 80, when radio frequency power is supplied to the antenna 85 from the radio frequency power source 87 via the matching box 86, an electromagnetic field is generated by the antenna 85. The electric field components of the electromagnetic field are shielded by the Faraday shield plate 82 and thus cannot propagate downwardly. On the other hand, the magnetic field components propagate into the plasma processing region P3 through the plurality of slits 82*s* in the Faraday shield plate 82. According to the magnetic field components, plasma is generated from the reformed gas supplied from the reaction gas nozzle 33 to the plasma processing region P3 at a predetermined flow rate ratio (mixing ratio). The plasma generated in this manner can reduce the radiation damage caused on the thin film stacked on the wafer W and the damage caused on each member in the vacuum vessel 1, etc.

Further, as illustrated in FIG. 1, the deposition apparatus includes a controller 100 that is formed of a computer for controlling the operations of the entire apparatus. In the memory of the controller 100, a program is stored for causing the deposition apparatus to perform a deposition method to be described later under the control of the controller 100. In the program, a group of steps for executing the deposition method described below, is incorporated. The program is stored in a medium 102, such as a hard disk, a compact disk, a magneto-optical disk, a memory card, a flexible disk, and the like. The program is read into a storage 101 by a predetermined reading device and is installed in the controller 100.

Next, the reformed gas activated by the plasma generated by the plasma source 80 will be described. Generally, when a silicon oxide film ($SiO_2$ film) is deposited by using aminosilane gas as the raw material gas, a hydroxyl group (OH group) becomes an adsorption site, and the aminosilane gas is adsorbed on the OH group. However, when a recessed portion such as a trench or a via is formed on the surface of the wafer W, and embedding deposition is performed in the recessed portion, a bottom-up deposition method is preferable, in which the deposition is gradually advanced upward from the bottom surface of the recessed portion, in order to block the opening of the upper portion of the recessed portion and prevent a void from being formed in the recessed portion. In order to perform such a bottom-up deposition method, it is necessary to not form an OH group on the surface of the wafer W. For example, when a mixed gas of hydrogen ($H_2$) gas and $O_2$ gas (hereinafter, referred to as "$H_2/O_2$ gas") as a reformed gas is activated by plasma, a silicon oxide film having a good film quality can be deposited. However, when $H_2/O_2$ gas is used as the reformed gas, an OH group is formed from $H_2/O_2$, and an OH group, which is an adsorption site of the aminosilane gas, is formed on the upper surface of the wafer W, and, therefore, it is difficult to perform the bottom-up deposition method.

Further, for example, when a mixed gas of He gas and $O_2$ gas (hereinafter, referred to as "$H_2/O_2$ gas") is activated by plasma, a silicon oxide film having a good film quality can be deposited. However, when $He/O_2$ gas is used as the reformed gas, the surface of the wafer W is more likely to be oxidized than when $Ar/O_2$ gas is used as the reformed gas. Therefore, $He/O_2$ gas is not preferable in a process when it is desired to prevent the oxidation of the surface of the wafer W. The reason why a difference arises in the wafer oxidation amount, is that the ionization energy of He is greater than the ionization energy of Ar, i.e., He is less likely to become ions than Ar, and hence $He/O_2$ gas has a higher proportion of $O_2$ gas that becomes activated than $Ar/O_2$ gas.

Accordingly, in one embodiment, first, the first layer of the silicon oxide film is deposited on the wafer W by a first process including a reforming process in which a mixed gas of Ar gas and $O_2$ gas (hereinafter, referred to as "$Ar/O_2$ gas") is activated by plasma and supplied. Subsequently, by a second process including a reforming process of activating $He/O_2$ gas with plasma and supplying the activated $He/O_2$ gas, a second layer of the silicon oxide film is formed on top of the first layer of the silicon oxide film. In this case, the plasma-activated $Ar/O_2$ gas has a smaller effect of oxidizing the surface of the wafer W, than the plasma-activated $He/O_2$ gas. Therefore, it is possible to deposit a silicon oxide film while preventing the oxidation of the wafer W. Also, with the plasma-activated $He/O_2$ gas, it is possible to deposit a silicon oxide film having better film quality than the plasma-activated $Ar/O_2$ gas. Note that the plasma-activated $He/O_2$ gas has a greater effect of oxidizing the surface of the wafer W than the plasma-activated $Ar/O_2$ gas, but when supplying the plasma-activated $He/O_2$ gas, the surface of the wafer W is covered with the first layer of the silicon oxide film. Thus, the first layer of silicon oxide film functions as a protective layer that prevents the oxidation of the surface of the wafer W by plasma-activated $He/O_2$ gas. As a result, the oxidation of the surface of the wafer W is prevented. In this manner, in one embodiment, a silicon oxide film having a good film quality can be deposited while preventing the oxidation of the wafer W.

(Deposition Method)

Figure 9:
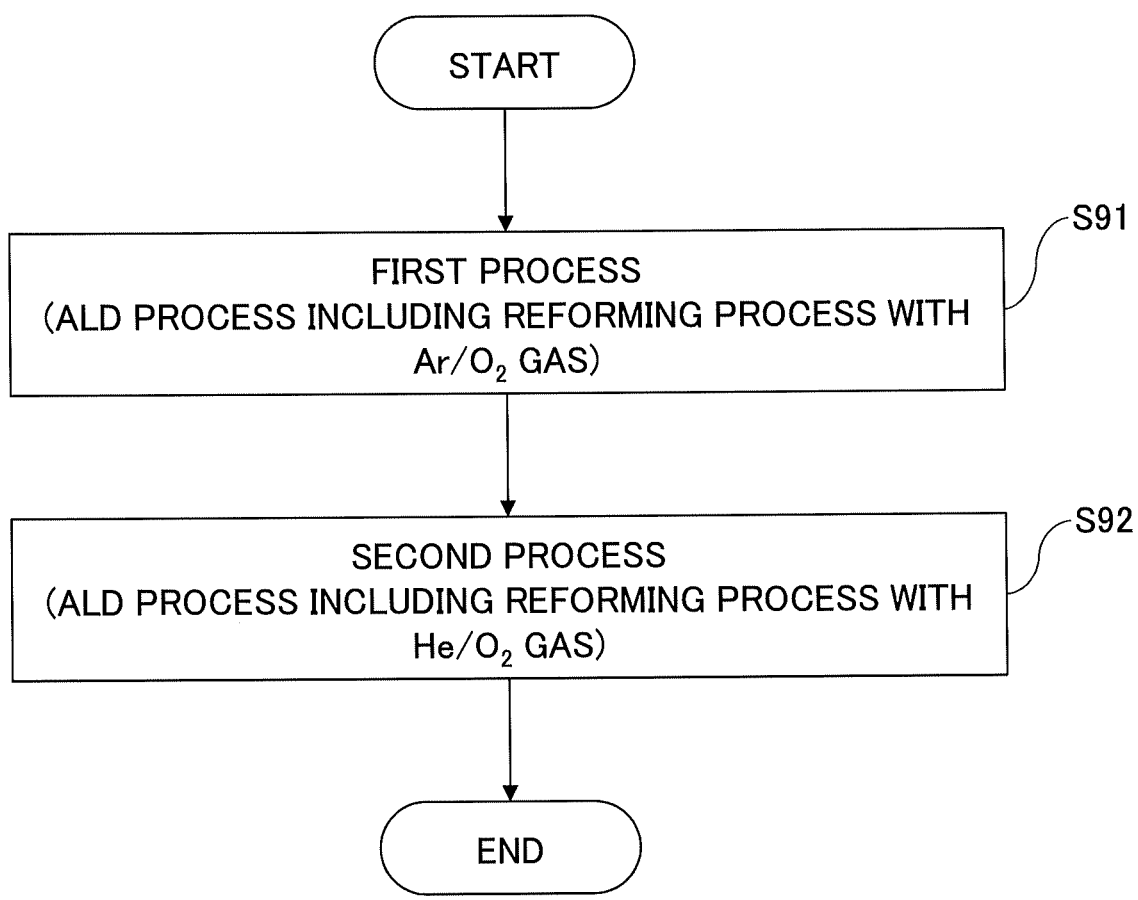
FIG. 9 is a flow chart illustrating a deposition method according to one embodiment.

The deposition method according to one embodiment will be described with reference to FIG. 9. FIG. 9 is a flowchart illustrating a deposition method according to one embodiment.

As illustrated in FIG. 9, the deposition method according to one embodiment is a method of depositing a silicon oxide film on the wafer W by executing a first process (step S91) and a second process (step S92) in the stated order. The first process (step S91) is a process of depositing a first layer of the silicon oxide film on the wafer W by an ALD process including a reforming process with Ar/He gas. The second process (step S92) is a process of depositing a second layer of the silicon oxide film on the first layer of the silicon oxide film by an ALD process including a reforming process with $He/O_2$ gas. The first process (step S91) and the second process (step S92) are performed continuously, for example, without exposing the wafer W to air. Further, it is preferable that the number of times of repeating the ALD process in the first process (step S91) is smaller than the number of times of repeating the ALD process in the second process (step S92), particularly in view of the ability to deposit a silicon oxide film having a good film quality. However, for example, the number of times of repeating the ALD process in the first process (step S91) may be greater than the number of times of repeating the ALD process in the second process (step S92).

Figure 10A:
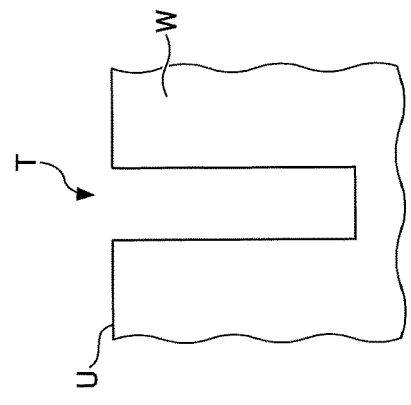
FIGS. 10A to 10H are diagrams illustrating a first process of the deposition method according to one embodiment.

Hereinafter, a deposition method according to one embodiment will be described with reference to an example in which a silicon oxide film is deposited by using the above-described deposition apparatus. FIGS. 10A to 10H are diagrams for describing the first process (step S91) of the deposition method according to one embodiment. FIGS. 11A to 11G are diagrams for describing the second process (step S92) of the deposition method according to one embodiment. In one embodiment, a description is given of an example in which a silicon oxide film is deposited by being embedded in a trench T of the wafer W in which the trench T is formed on the surface of the wafer W, as illustrated in FIG. 10A. The trench T is an example of a recessed portion formed on a surface U of the wafer W; other than the trench T, a via hole and the like may be formed.

First, the gate valve is opened and the conveying arm 10 transfers the wafer W from the outside into the recessed portion 24 of the rotation table 2 via the conveying port 15. The wafer W is transferred by raising and lowering the raising/lowering pin from the bottom side of the vacuum vessel 1 through a through hole in the bottom surface of the recessed portion 24 when the recessed portion 24 stops at a position facing the conveying port 15. The transferring of the wafer W is performed by intermittently rotating the rotation table 2, so that each of the wafers W is mounted on one of the five recessed portions 24 of the rotation table 2.

Next, the gate valve is closed and the inside of the vacuum vessel 1 is exhausted to a vacuum level attainable by the vacuum pump 64. Subsequently, Ar gas is discharged at a predetermined flow rate as the separation gas from the separation gas nozzles 41 and 42, and Ar gas is discharged at a predetermined flow rate from the separation gas supply pipe 51 and the purge gas supply pipe 72. Further, the inside of the vacuum vessel 1 is controlled to a preset processing pressure by the pressure controller 65. Then, the wafer W is heated to, for example, 400° C. by the heater unit 7 while rotating the rotation table 2 clockwise at, for example, a rotation speed of 5 rpm.

Subsequently, aminosilane gas is supplied from the reaction gas nozzle 31 and $O_3$ gas is supplied from the reaction gas nozzle 32. Further, $Ar/O_2$ gas is supplied from the reaction gas nozzle 33, and a radio frequency electric power having a frequency of 13.56 MHz is supplied at a magnitude of, for example, 4000 W, to the antenna 85 of the plasma source 80. Accordingly, an oxygen plasma is generated in the plasma processing region P3 between the plasma source 80 and the rotation table 2. In the oxygen plasma, active species, such as oxygen ions and oxygen radicals, and high-energy particles are generated.

Figure 10B:
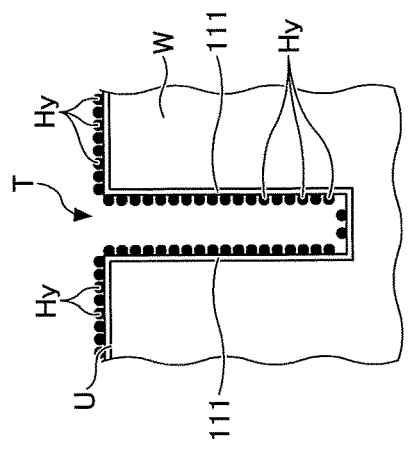
Figure 10C:
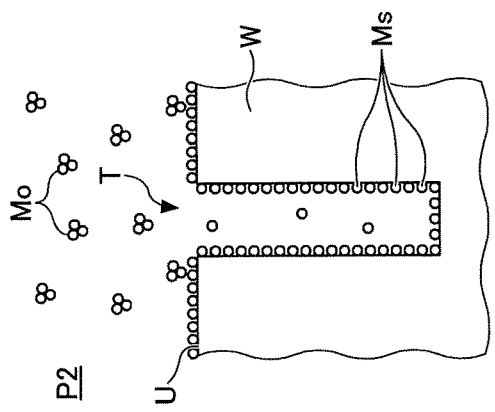
Figure 10D:
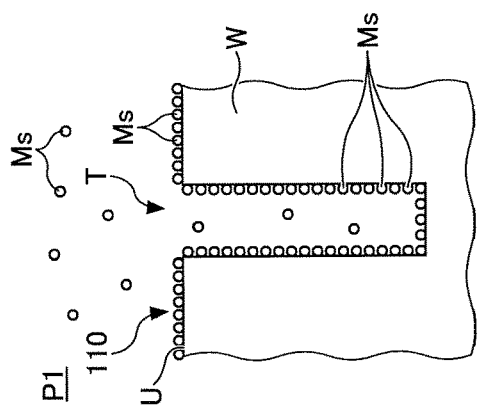

According to the rotation of the rotation table 2, the wafer W repeatedly passes through the aminosilane gas adsorption region P1, the separation region D, the oxidation gas supply region P2, the plasma processing region P3, and the separation region, in the stated order. As illustrated in FIG. 10B, in the aminosilane gas adsorption region P1, molecules Ms of aminosilane gas are adsorbed on the surface U of the wafer W and the inner surface of the trench T to form a molecular layer 110 of the aminosilane. After passing through the separation region D, as illustrated in FIG. 10C, in the oxidation gas supply region P2, the aminosilane gas adsorbed on the surface U of the wafer W and the inner surface of the trench T are oxidized by $O_3$ gas molecules Mo. Accordingly, as illustrated in FIG. 10D, a layer of a silicon oxide film 111 is deposited along the inner surface of the trench T. Further, when the aminosilane gas is oxidized, an OH group Hy is generated as a by-product, and the generated OH group Hy is adsorbed onto the surface of the silicon oxide film 111.

Figure 10E:
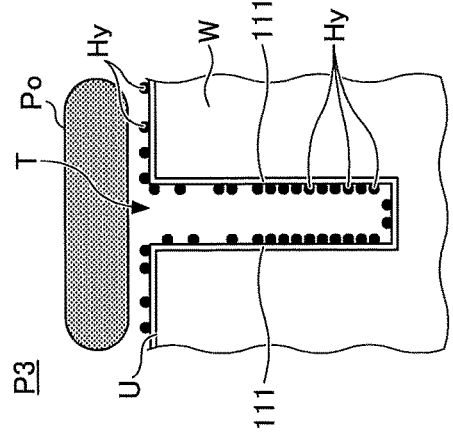

Next, when the wafer W reaches the plasma processing region P3 of the plasma source 80, as illustrated in FIG. 10E, the wafer W is exposed to oxygen plasma Po. At this time, a portion of the OH group Hy adsorbed on the silicon oxide film 111 is desorbed from the layer of the silicon oxide film 111 by, for example, collision of high energy particles in the oxygen plasma Po. The oxygen plasma Po reaches the surface U of the wafer W and near the opening of the trench T, but does not appreciably reach near the bottom of the trench T. Thus, on the surface U of the wafer W and on the side surfaces near the opening of the trench T, a relatively large amount of the OH group Hy is desorbed. As a result, as illustrated in FIG. 10E, the OH group Hy is distributed so that the density of the OH group Hy is high at the bottom and at the side surfaces near the bottom of the trench T, and the density is low toward the opening of the trench T and the surface U of the wafer W. In this case, the $Ar/O_2$ gas, which has a small effect of oxidizing the surface of the wafer W, as the reformed gas, is activated by plasma and supplied, and, therefore, oxidation of the wafer W is prevented.

Figure 10F:
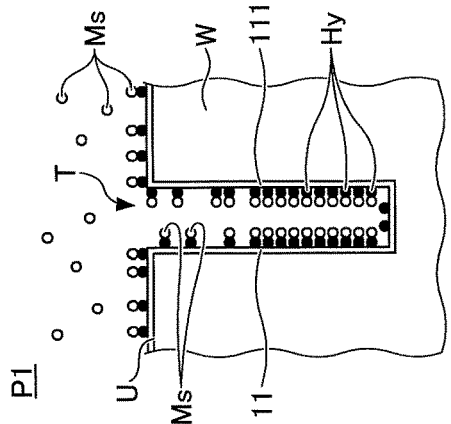

Next, when the wafer W again reaches the aminosilane gas adsorption region P1 by rotation of the rotation table 2, the molecules Ms of the aminosilane gas supplied from the reaction gas nozzle 31 are adsorbed to the surface U of the wafer W and the inner surface of the trench T. At this time, because the molecules Ms of the aminosilane gas are easily adsorbed by the OH group Hy, as illustrated in FIG. 10F, the molecules Ms are adsorbed to the surface U of the wafer W and the inner surface of the trench T in a distribution according to the distribution of the OH group Hy. That is, the molecules Ms of the aminosilane gas are adsorbed to the inner surface of the trench T such that the density is high at the bottom and the side surfaces near the bottom of the trench T and the density is low toward the opening of the trench T.

Figure 10G:
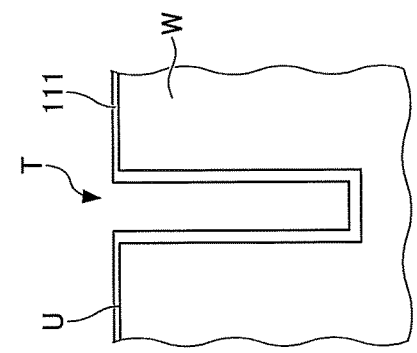

Subsequently, as the wafer W passes through the oxidation gas supply region P2, the aminosilane gas adsorbed on the surface U of the wafer W and the inner surface oil the trench T is oxidized by $O_3$ gas, and as illustrated in FIG. 10G, the silicon oxide film 111 is further deposited. At this time, the density of the aminosilane gas adsorbed on the inner surface of the trench T is applied to the thickness distribution of the silicon oxide film 111. That is, the silicon oxide film 111 thickens at the bottom and at the side surfaces near the bottom of the trench T and thins toward the opening of the trench T. Then, the OH group Hy generated by the oxidation of the aminosilane gas is adsorbed to the surface of the silicon oxide film 111.

Next, as the wafer W again reaches the plasma processing region P3 of the plasma source 80, as described above, the OH group Hy is distributed such that the density of the OH group Hy is high at the bottom and side surfaces near the bottom of the trench T and the density is low toward the opening of the trench T.

Figure 10H:
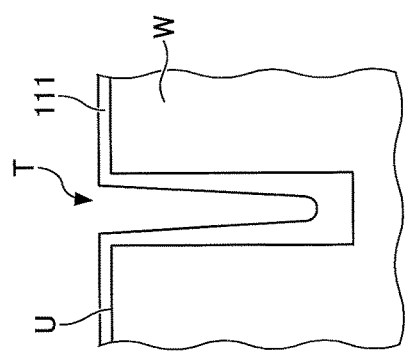

Subsequently, as the above-described process is repeated, the silicon oxide film 111 thickens from the bottom of the trench T, as illustrated in FIG. 10H.

Next, in a state where the aminosilane gas is supplied from the reaction gas nozzle 31 and $O_3$ gas is supplied from the reaction gas nozzle 32, the reformed gas supplied from the reaction gas nozzle 33 is switched from $Ar/O_2$ gas to $He/O_2$ gas. Further, a radio frequency electric power having a frequency of 13.56 MHz is supplied at a magnitude of, for example, 4000 W, to the antenna 85 of the plasma source 80. Accordingly, an oxygen plasma is generated in the plasma processing region P3 between the plasma source 80 and the rotation table 2. In the oxygen plasma, active species, such as oxygen ions and oxygen radicals, and high-energy particles, are generated.

According to the rotation of the rotation table 2, the wafer W repeatedly passes through the aminosilane gas adsorption region P1, the separation region D, the oxidation gas supply region P2, the plasma processing region P3, and the separation region D in the stated order. As illustrated in FIG. 11A, in the aminosilane gas adsorption region P1, the molecules Ms of the aminosilane gas are adsorbed on the surface of the silicon oxide film 111 deposited on the surface U of the wafer W and the inner surface of the trench T, to form a molecular layer 120 of the aminosilane. After passing through the separation region D, in the oxidation gas supply region P2, as illustrated in FIG. 11B, the aminosilane gas adsorbed to the surface of the silicon oxide film 111 is oxidized by the $O_3$ gas molecules Mo. Accordingly, as illustrated in FIG. 11C, a layer of a silicon oxide film 121 is deposited along the surface of the silicon oxide film 111. Further, when the aminosilane gas is oxidized, an OH group Hy is generated as a by-product, and the generated OH group Hy is adsorbed onto the surface of the silicon oxide film 121.

Next, when the wafer W reaches the plasma processing region P3 of the plasma source 80, as illustrated in FIG. 11D, the wafer W is exposed to the oxygen plasma Po. At this time, a portion of the OH group Hy adsorbed on the silicon oxide film 121 is desorbed from the layer of the silicon oxide film 121, for example, by collision of high energy particles in the oxygen plasma Po. The oxygen plasma Po reaches the surface U of the wafer W and near the opening of the trench T, but does not appreciably reach near the bottom of the trench T. Thus, a relatively large amount of the OH group Hy is desorbed from the surface U of the wafer W and from the side surfaces near the opening of the trench T. As a result, as illustrated in FIG. 11D, the OH group Hy is distributed such that the density of the OH group Hy is high at the bottom and the side surfaces near the bottom of the trench T, and the density is low toward the opening of the trench T and the surface U of the wafer W. In this case, $He/O_2$ gas, by which a silicon oxide film with good film quality can be deposited, is activated by plasma and supplied, and, therefore, a silicon oxide film with good film quality can be deposited. Note that the plasma-activated $He/O_2$ gas has a greater effect of oxidizing the surface of the wafer W than the plasma-activated $Ar/O_2$ gas, but when supplying the plasma-activated $He/O_2$ gas, the surface of the wafer W is covered with the silicon oxide film 111. Thus, the silicon oxide film 111 functions as a protective layer to prevent the surface of the wafer W from being oxidized by the plasma-activated $He/O_2$ gas. As a result, the oxidation of the surface of the wafer W is prevented.

Next, when the wafer W again reaches the aminosilane gas adsorption region P1 by the rotation of the rotation table 2, the molecules Ms of the aminosilane gas supplied from the reaction gas nozzle 31 are adsorbed to the surface U of the wafer W and the inner surface of the trench T. At this time, because the molecules Ms of the aminosilane gas are easily adsorbed by the OH group Hy, as illustrated in FIG. 11E, the molecules Ms are adsorbed to the surface U of the wafer W and the inner surface of the trench T in a distribution according to the distribution of the OH group Hy. That is, the molecules Ms of the aminosilane gas are adsorbed to the inner surface of the trench T such that the density is high at the bottom and the side surfaces near the bottom of the trench T and the density is low toward the opening of the trench T.

Then, as the wafer W passes through the oxidation gas supply region P2, the aminosilane gas that has adsorbed on the surface U of the wafer W and the inner surface of the trench T is oxidized by $O_3$ gas, and the silicon oxide film 121 is further deposited. At this time, the density of the aminosilane gas adsorbed on the inner surface of the trench T is applied to the thickness distribution of the silicon oxide film 121. That is, the silicon oxide film 121 thickens at the bottom and the side surfaces near the bottom of the trench T and thins toward the opening of the trench T. Then, the OH group Hy generated by the oxidation of the aminosilane gas is adsorbed to the surface of the silicon oxide film 121.

Next, as the wafer W again reaches the plasma processing region P3 of the plasma source 60, the OH group Hy is distributed such that the density of the OH group Hy is high at the bottom and the side surfaces near the bottom of the trench T and the density is low toward the opening of the trench T as described above.

Subsequently, as the above-described process is repeated, as illustrated in FIG. 11F, the silicon oxide film 121 thickens from the bottom of the trench T, and as illustrated in FIG. 11G, the embedding of the trench T is completed.

As described above, according to the deposition method according to one embodiment, in the reforming process of the silicon oxide film 111 performed in the plasma processing region P3, first, the reforming process is performed using $Ar/O_2$ gas having a small effect of oxidizing the wafer W. Subsequently, a reforming process is performed using $He/O_2$ gas capable of depositing a silicon oxide film having good film quality on the silicon oxide film 111. Thus, it is possible to deposit a silicon oxide film with good film quality while preventing the oxidation of the wafer W.

Note that in the deposition method according to one embodiment, plasma-activated $H_2/O_2$ gas is not supplied, and, therefore, an OH group is not generated by the reformed gas. Therefore, the thickness of the silicon oxide film on the surface U of the wafer W tends to be thin, and bottom-up deposition is performed.

Further, before the above-described deposition process is performed, a silicon nitride film is formed in advance as an under layer on the surface of the wafer W, and the deposition process described in FIGS. 10A to 11G may be performed on the underlayer.

(Practical Example)

With respect to the deposition method according to one embodiment, a description is given of a practical example performed in order to identify gas that can be suitably used as the reformed gas used in the first process (step S91) and the reformed gas used in the second process (step S92). Hereinafter, the reformed gas used in the first process (step S91) and the reformed gas used in the second process (step S92) are also referred to as the first reformed gas and the second reformed gas, respectively. In the practical example, four types of gas were used as reformed gases: $Ar/O_2$ gas ($Ar/O_2$=15000/75 sccm), $He/O_2$ gas ($He/O_2$=15000/75 sccm), Ar gas (Ar=15000 sccm), and He gas (He=15000 sccm).

Figure 12:
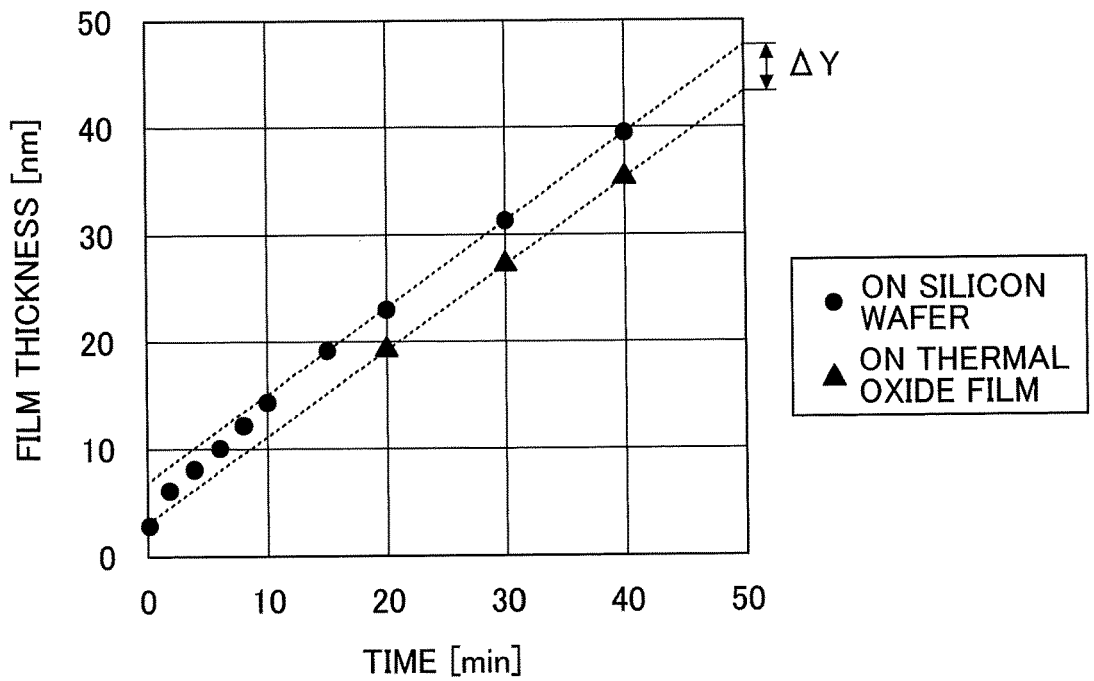
FIG. 12 is a diagram for explaining a method for evaluating the wafer oxidation amount.

FIG. 12 is a diagram for explaining a method for evaluating the wafer oxidation amount. In FIG. 12, the horizontal axis represents the time [min] and the vertical axis represents the film thickness [nm]. The circles in FIG. 12 represent the relationship between the time of depositing the silicon oxide film on a silicon (Si) wafer by an ALD process including a reforming process using $Ar/O_2$ gas as the reformed gas and the film thickness of the silicon oxide film. On the other hand, the triangles in FIG. 12 represent the relationship between the time of depositing the silicon oxide film on a thermal oxide film by an ALD process including a reforming process using $Ar/O_2$ gas as the reformed gas and the film thickness of the silicon oxide film.

As illustrated in FIG. 12, when a silicon oxide film is deposited on a thermal oxide film by an ALD process including a reforming process using $Ar/O_2$ gas, the film thickness of the silicon oxide film increases in proportion to the deposition time. On the other hand, when a silicon oxide film is deposited on a Si wafer by an ALD process including a reforming process using $Ar/O_2$ gas, the film thickness of the silicon oxide film increases in proportion to the deposition time during a period after a predetermined time (15 minutes in the case of FIG. 12) elapses from the start of deposition. However, during the period until the predetermined time elapses, the rate of increase in the thickness of the silicon oxide film is greater than in the period after the predetermined time elapses. This is probably due to the fact that the silicon oxide film is stacked by vapor phase growth on the thermal oxide film, whereas on the Si wafer, the silicon oxide film is formed by surface oxidation of the Si wafer in addition to the stacking of the silicon oxide film by vapor phase growth during the initial deposition period.

Accordingly, in the practical example, a difference $\Delta Y$ between the thickness of the silicon oxide film deposited on the Si wafer after the predetermined time has elapsed and the thickness of the silicon oxide film deposited on the thermal oxide film, was calculated, and the calculated difference $\Delta Y$ was evaluated as the wafer oxidation amount.

Figure 13:
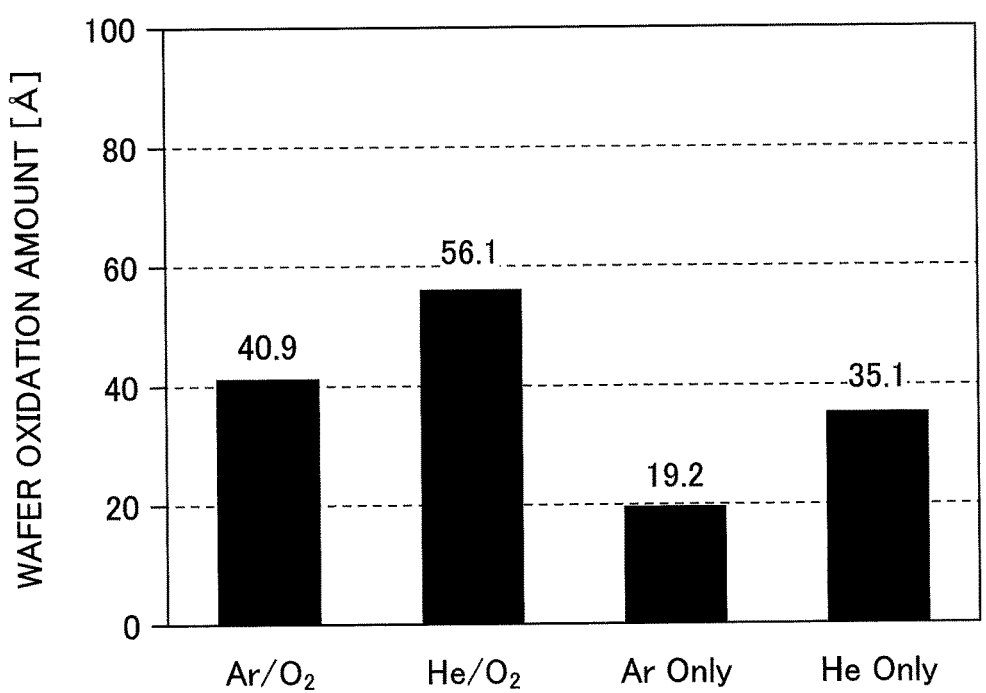
FIG. 13 is a diagram illustrating a relationship between the type of reformed gas and the wafer oxidation amount.

FIG. 13 is a diagram illustrating the relationship between the type of reformed gas and the wafer oxidation amount. In FIG. 13, the horizontal axis indicates the type of reformed gas and the vertical axis indicates the wafer oxidation amount [Å].

As illustrated in FIG. 13, the wafer oxidation amounts when using $Ar/O_2$ gas, $He/O_2$ gas, Ar gas, and He gas as the reformed gas, were 40.9 Å, 56.1 Å, 19.2 Å, and 35.1 Å, respectively. From these results, it can be seen that, from the viewpoint of reducing the wafer oxidation amount, the suitable reformed gas is Ar gas, He gas, $Ar/O_2$ gas, and $He/O_2$ gas, stated in preferential order.

Figure 14:
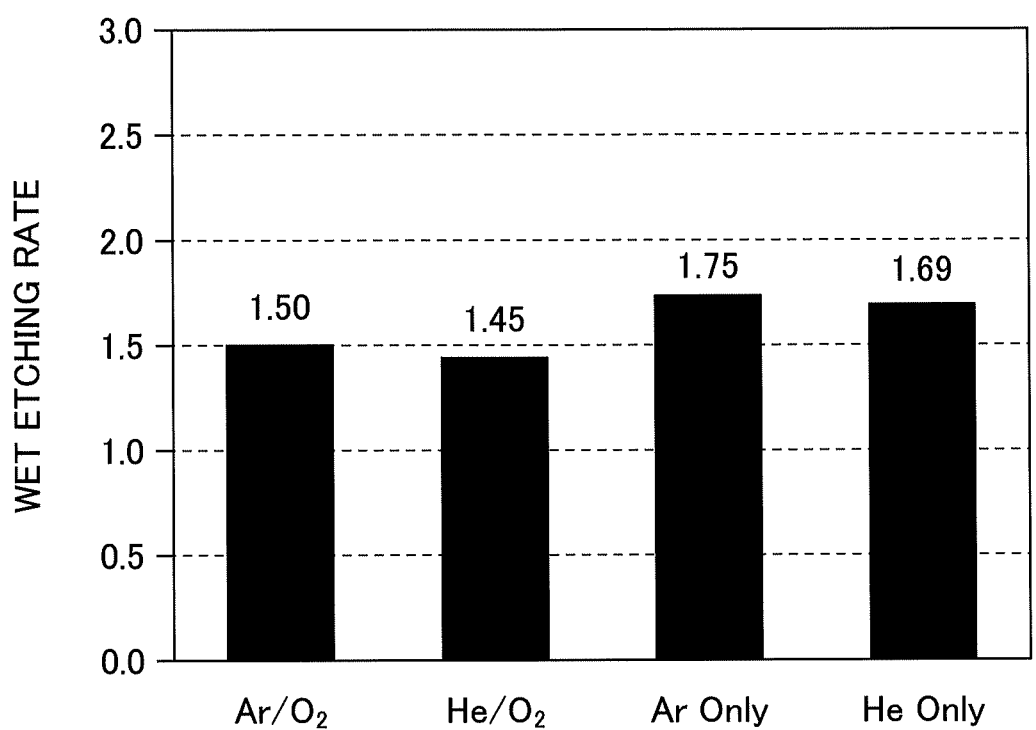
FIG. 14 is a diagram illustrating the relationship between the type of reformed gas and the wet etching rate.

FIG. 14 is a diagram illustrating the relationship between the type of reformed gas and the wet etching rate. In FIG. 14, the horizontal axis represents the type of reformed gas and the vertical axis represents the wet etching rate. The wet etching rate illustrated on the vertical axis is the wet etching rate of the silicon oxide film when the wet etching rate of the thermal oxide film is 1.

As illustrated in FIG. 14, the wet etching rates when using $Ar/O_2$ gas, $He/O_2$ gas, Ar gas, and He gas as the reformed gases were 1.50, 1.45, 1.75, and 1.69, respectively. From these results, it can be seen that, from the viewpoint of depositing a fine film having a low wet etching rate, that is, a film having good film quality, the suitable reformed gas is $He/O_2$ gas, $Ar/O_2$ gas, He gas, and Ar gas, stated in preferential order.

As described above, determining from the results illustrated in FIGS. 13 and 14, from the viewpoint of depositing a silicon oxide film with good film quality while preventing oxidation of the wafer, it is preferable to use $Ar/O_2$ gas as the first reformed gas and to use $He/O_2$ gas as the second reformed gas. However, as the first reformed gas and the second reformed gas, any kind of relevant gas can be used as long as the first reformed gas has a smaller effect of oxidizing the wafer than the second reformed gas. For example, the first reformed gas may be Ar gas, and the second reformed gas may be He gas. In this case, the film reality is not as good as the case of using $Ar/O_2$ gas as the first reformed gas and using $He/O_2$ gas as the second reformed gas; however, the wafer oxidation amount can be particularly reduced.

Further, for example, Ar gas may be used as the first reformed gas, $Ar/O_2$ gas may be used as the second reformed gas, He gas may be used as the first reformed gas, and $He/O_2$ gas may be used as the second reformed gas.

According to one embodiment of the present invention, a silicon oxide film having a good film quality can be deposited on a substrate, while preventing the oxidation of the substrate.

The deposition method according to the embodiment disclosed herein are to be considered exemplary in all respects and not limiting. The above embodiment and its variations may include omissions, substitutions, or modifications in various forms without departing from the appended claims and the gist thereof.

The invention claimed is:

1. A deposition method of causing a silicon oxide film to be embedded in a recess formed on a substrate, the deposition method comprising:
   a first process performed by repeating:
      causing aminosilane gas to be adsorbed on the substrate;
      causing a first silicon oxide film to be stacked on the substrate by supplying oxidation gas to the substrate to oxidize the aminosilane gas adsorbed on the substrate; and
      performing a reforming process on the first silicon oxide film by activating a first reformed gas by plasma and supplying the first reformed gas to the first silicon oxide film, whereby a surface and an internal surface of the recess of the substrate is covered with the first silicon oxide film by the first process in bottom-up deposition, the first reformed gas being a mixed gas of Ar gas and $O_2$ gas, and
   a second process, performed after the first process, by repeating:
      causing aminosilane gas to be adsorbed on the first silicon oxide film;
      causing a second silicon oxide film to be stacked on the first silicon oxide film by supplying oxidation gas to the first silicon oxide film to oxidize the aminosilane gas adsorbed on the first silicon oxide film; and
      performing a reforming process on the second silicon oxide film by activating a second reformed gas by plasma and supplying the second reformed gas to the second silicon oxide film, whereby the recess covered with the first silicon oxide film is filled with the second silicon oxide film by the second process in the bottom-up deposition, the second reformed gas being a mixed gas of He gas and $O_2$ gas.

2. The deposition method according to claim 1, wherein a number of times of repeating the causing of the aminosilane gas to be adsorbed, the causing of the first silicon oxide film to be stacked, and the performing of the reforming process on the first silicon oxide film in the first process, is less than a number of times of repeating the causing of the aminosilane gas to be adsorbed, the causing of the second silicon oxide film to be stacked, and the performing of the reforming process on the second silicon oxide film in the second process.

3. The deposition method according to claim 1, wherein the first process and the second process are continuously performed without exposing the substrate to air.

4. The deposition method according to claim 1, wherein the first process further includes:
supplying a first purge gas to the substrate between the causing of the aminosilane gas to be adsorbed and the causing of the first silicon oxide film to be stacked; and
supplying a second purge gas to the substrate between the performing of the reforming process on the first silicon oxide film and the causing of the aminosilane gas to be adsorbed, and
the second process further includes:
supplying the first purge gas to the substrate between the causing of the aminosilane gas to be adsorbed and the causing of the second silicon oxide film to be stacked; and
supplying the second purge gas to the substrate between the performing of the reforming process on the second silicon oxide film and the causing of the aminosilane gas to be adsorbed.

5. The deposition method according to claim 4, wherein
the substrate is disposed on a rotation table provided inside a vacuum vessel, along a circumferential direction of the rotation table,
above the rotation table inside the vacuum vessel, an aminosilane gas adsorption region, a first separation region, an oxidation gas supply region, a plasma processing region, and a second separation region are provided along a rotational direction of the rotation table, and
by rotating the rotation table, in the first process and the second process, the causing of the aminosilane gas to be adsorbed, the supplying of the first purge gas, the causing of the first silicon oxide film or the second silicon oxide film to be stacked, the performing of the reforming process on the first silicon oxide film or the second silicon oxide film, and the supplying of the second purge gas, are repeated.

6. The deposition method according to claim 1, wherein on a surface of the substrate, an underlayer including a silicon nitride film is formed in advance.

* * * * *